United States Patent
Brack

[15] 3,657,664

[45] Apr. 18, 1972

[54] FREQUENCY SYNTHESIZER

[72] Inventor: Werner Brack, Oyster Bay, N.Y.

[73] Assignee: Communications Associates, Inc., Huntington Station, N.Y.

[22] Filed: Oct. 2, 1970

[21] Appl. No.: 77,504

[52] U.S. Cl. ....................................331/1 A, 331/10, 331/17
[51] Int. Cl. ...........................................................H03b 3/06
[58] Field of Search .........................................331/1, 10, 17

[56] References Cited

UNITED STATES PATENTS 3,484,712 12/1969 Foote et al.....................................331/1

*Primary Examiner*—John Kominski
*Attorney*—Leonard H. King

[57] ABSTRACT

A frequency synthesizer having a phase lock loop for regulating a voltage controlled oscillator with reference to a stable oscillator frequency. The desired frequency is set on decade switches. An encoder converts the frequency value to a binary coded decimal equivalent nine's complement number and presets a decade counter. An offset frequency is preintroduced into the counter by fixing the maximum count. Upon counting the maximum count, a shift register is triggered and during the shifting operation, the system is reset. The maximum count is reduced by the number of stages in the shift register. A steering voltage generator incorporating a staircase generator and an electronically switched filter is placed in parallel with the phase lock loop, and provides a coarse tuning of the voltage controlled oscillator.

11 Claims, 5 Drawing Figures

INVENTOR.
WERNER BRACK
BY Leonard H. King
ATTORNEY

INVENTOR.
WERNER BRACK

BY Leonard H. King

ATTORNEY

PATENTED APR 18 1972

3,657,664

SHEET 3 OF 5

INVENTOR.
WERNER BRACK

BY Leonard H. King

ATTORNEY

INVENTOR.
WERNER BRACK
BY
Leonard H. King
ATTORNEY

INVENTOR.
WERNER BRACK
BY Leonard H. King
ATTORNEY

FREQUENCY SYNTHESIZER

The aforementioned abstract is neither intended to define the invention of the application which, of course, is measured by the claims, nor is it intended to be limiting as to the scope of the invention in any way.

This invention relates to a frequency synthesizer and more particularly to a high stability frequency synthesizer for use in HF communication systems, where stability and reliability are of prime importance.

BACKGROUND OF THE INVENTION

It is quite well known in the art to use a phase locked digital synthesizer having a variable counter or divider, phase detector and voltage controlled oscillator to generate coherent frequencies. Briefly, this type of frequency synthesizer utilizes the voltage controlled oscillator to generate the desired coherent output frequency in response to the phase detector output signal. The output frequency is fed back to the phase detector through a variable divider to be compared with a reference frequency generated by a stable frequency reference.

While these known systems may be very simple, there are great difficulties in making these systems both fast and wide range. The speed of the systems is generally impaired by the fact that after each counting cycle, the variable counter must be reset to zero or to a certain preset number. In order to cover a wide range of frequencies, the generated signals must be translated in frequency to the desired frequency by mixing the generated signals with an internal injection frequency. Further delays result from the operation of the counter itself. It is generally desirable to employ a decimal rather than a binary control arrangement for ease of selection of a desired frequency signal. However, decade counting circuits have a propagating delay caused by the switching stages in the decade counter which slows the operation of the entire system.

Prior synthesizers have also been subject to instabilities including frequency jitter, because of the wide frequency discrepancies between the ultimate output of the synthesizer and the reference frequency source. Many cycles of the output frequency would occur during each cycle of the reference frequency source and the output frequency could change between times when the output is sampled for comparison with the reference frequency.

To alleviate these and other problems, prior art systems have used a second phase lock loop, a plurality of reference oscillators, or octave multipliers. However, all these devices result in a more complex and costly system.

Briefly, this invention has a series of decade switches which set the desired frequency. An encoder transforms the decade number into its equivalent nine's complement and puts it in Binary Coded Decimal (BCD) format. The output from the encoder feeds a decade counter which is preset with a built in offset frequency. This built in offset eliminates the need for independent mixers which add the offset or injection frequency. By using equivalent nine's complemented numbers, the switches do not generate a carry from stage to stage which makes the system faster and simpler. When the counter reaches a preset maximum it generates a pulse to a shift register. The counter preset maximum is reduced by a fixed number equal to the number of stages in the shift register. During operation of the shift register, the counter and encoder are preset. This eliminates the reset delay between consecutive cycles. The output from the shift register feeds a phase comparator where it is compared with a reference frequency. The error signal is used as a phase lock up for the voltage controlled oscillator as in the prior art. The error signal is also used to control a steering voltage generator having a staircase voltage generator for course tuning of the voltage controlled oscillator.

Accordingly, it is an object of this invention to provide an improved high stability frequency synthesizer.

Another object is to provide a frequency synthesizer which is stable and reliable in its operation, and which may be set to any desired signal frequency throughout a wide frequency range.

Yet another object is to provide an improved frequency synthesizer which can be used in HF communication systems using digital integrated circuits to provide a flexible and highly stable system.

Yet a further object is to provide a frequency synthesizer which has a phase comparator for phase lock up and a voltage generator for coarse tuning of the voltage controlled oscillator.

Still another object is to provide a frequency synthesizer wherein the frequency is set by decade switches so that the decade switches are reading the operating frequency, whereas the synthesizer produces an output frequency offset by a fixed increment as may be required as injection frequency in superheterodyne receiving systems and transmitter frequency translating schemes commonly employed in single sideband communication systems.

Still another object is to provide a frequency synthesizer wherein the frequency is set by decade switches which encode the dial setting into an equivalent nine's complement number.

Yet another object is to provide a frequency synthesizer wherein the offset injection frequency is preset into the counter as part of the maximum number to which the counter can count.

These and other objects and advantages of the invention will become apparent from a consideration of the following specifications, taken in conjunction with the accompanying drawings.

DISCLOSURE OF THE BEST EMBODIMENTS

Figure 1:
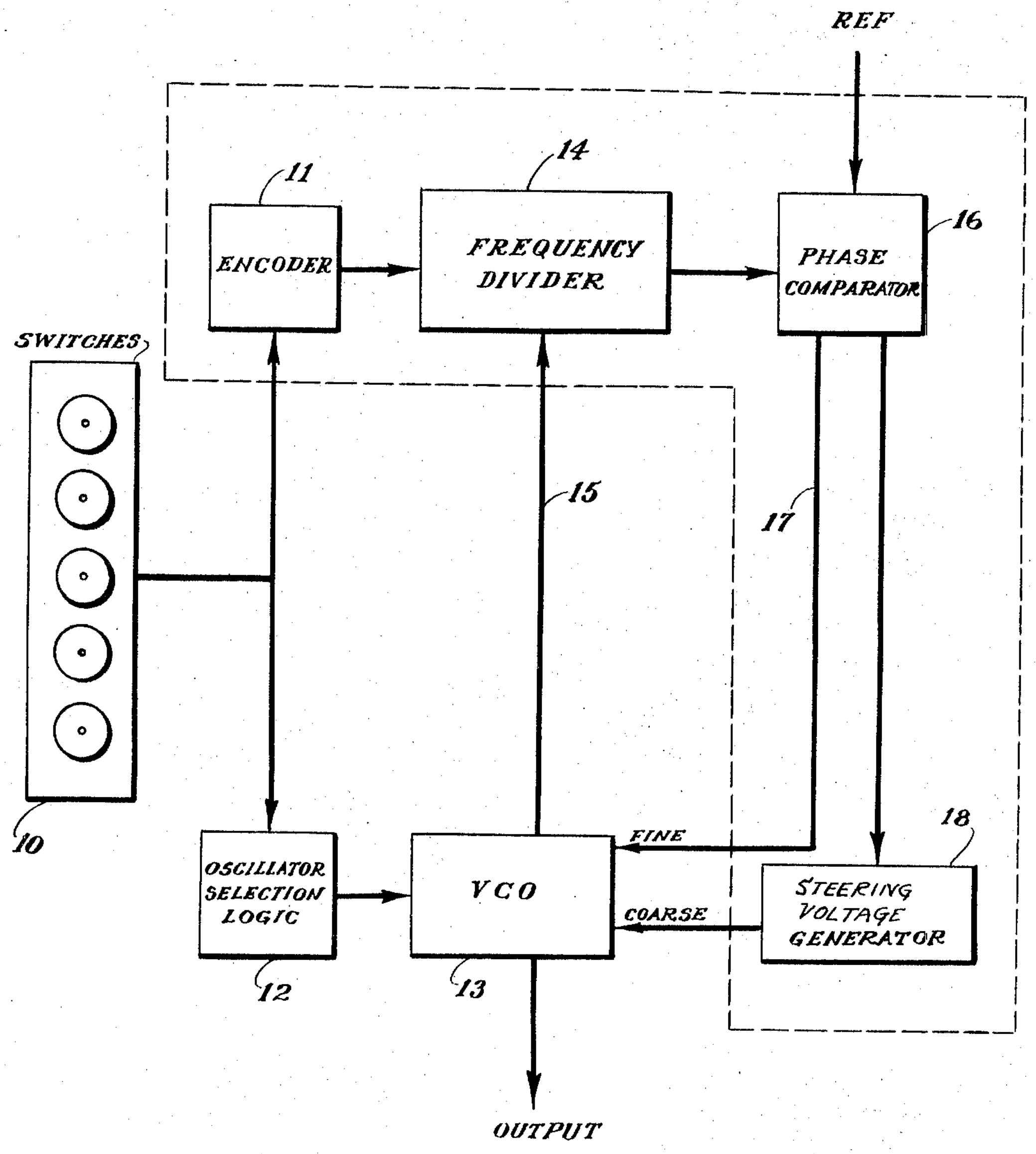
FIG. 1 is a block diagram of a frequency synthesizer in accordance with this invention.

The invention as shown in FIG. 1 includes a group of decade switches shown generally at 10. These switches have dials which appear at the front panel of the system and are set by the operator at the desired frequency output of the equipment employing the synthesizer. It is understood that this frequency could also be automatically set by electronic means. The output from the switches 10 is fed to an encoder 11 as well as a logic circuit 12 for selecting the appropriate voltage controlled oscillator 13. The output of the frequency synthesizer is taken directly from the voltage controlled oscillator 13. It is understood that a plurality of VCO's could be used, each for a different range, and the oscillator selection logic would select the appropriate one.

The encoder converts the preset decade number into its equivalent nine's complement and encodes the latter number into binary coded decimal format. The binary coded decimal equivalent nine's complement is fed into a frequency divider 14. This unit comprises a presettable counter, a coincidence gate, a shift register and other parts to be hereinafter described. The frequency divider counts the number of pulses from the VCO entering at line 15 and when it reaches the desired number as set on the decade switches 10, produces an output pulse to the phase comparator 16. The phase comparator has, as its second input, a reference signal from a stable crystal controlled oscillator. The phase comparator compares the frequency difference between the pulse rate coming from the frequency divider 14 and the reference frequency. The error signal is fed to the VCO on line 17 to provide fine correction through phase lock up as is known in prior systems. A second output feeds a steering voltage generator 18 which generates a voltage for coarse tuning of the VCO 13.

Reference is made to Table 1 for a fuller explanation of the binary coded decimal nine's complement, as is used in conjunction with this invention. The first column lists the decimal numbers zero through nine. These decimal numbers correspond to the positions on the decade switches 10, shown in FIG. 1. As is well known in the art, these decimal numbers can be represented by binary numbers and grouped according to decimal digits to form a binary coded number. The complement of each decimal digit is formed by subtracting the digit from 10, this is shown in the next column. To form the nine's complement, the decimal digit is subtracted from nine or one less than the maximum count of that digit position. The nine's complement can similarly be encoded into binary coded decimal, to form the binary coded decimal nine's complement shown in the last column.

TABLE 1

| Decimal | Binary coded decimal (BCD) | Decimal complement | Nine's complement | Nine's complement in BCD |
|---|---|---|---|---|
| 0 | 0 | 0 | 9 | 8+1 |
| 1 | 1 | 9 | 8 | 8 |
| 2 | 2 | 8 | 7 | 4+2+1 |
| 3 | | 2+1 | 6 | 4+2 |
| 4 | 4 | 6 | 5 | 4+1 |
| 5 | 4+1 | 5 | 4 | 4 |
| 6 | 4+2 | 4 | 3 | 2+1 |
| 7 | 4+2+1 | 3 | 2 | 2 |
| 8 | 8 | 2 | 1 | 1 |
| 9 | 8+1 | 1 | 0 | 0 |

By using the nine's complement, the decade switches, and the decade counter work faster than prior art schemes. For example, should the maximum number, which the counter can count be preset at 1000, and should the desired output frequency be 475, the counter must be set at the number 525. The counter will then count from 525 to its maximum of 1000 which is the desired 475 count. It is, therefore, necessary to set the desired number 475 on the decade switches, take the complement thereof to form the number 525, and then set the counter at 525 and count. In this procedure, the switches and the counter are slowed down since "borrows" and "carries" are generated from stage to stage, as they go from nine to 10.

In this invention, the nine's complement is used. The counters will, therefore, count to a maximum of 999, and in order to count the desired number of 475, the counters must be preset to 524 which is the nine's complement of 475. Since the number 10 is never reached, neither the switches, nor the counters will have to generate "carry" or "borrow" signals, and the operation will proceed at a faster rate.

Generally, when using a frequency synthesizer in a communications system, an offset frequency must be injected. The offset frequency is generally added through a mixer operation. Using the preset decade counter, in conjunction with a nine's complement binary coded decimal encoder, it is not necessary to use a mixer, and the offset can be introduced directly into the counter without delaying the speed of the system. By using the equivalent nine's complement, you can eliminate the "carry" and "borrow" operations which result in the 10's complement system when an offset is introduced.

As an example, the frequency synthesizer of this invention as shown in the drawings is set to produce a maximum of 29.99 Mhz. The offset is 1.60 Mhz. The counter must therefore count to a maximum of 29.99 Mhz + 1.60 Mhz or 31.59 Mhz.

Each of the digits will be set based on the actual nine's complement, with the exception of the highest order digit. Since the highest order will only count up until, but not including three, the complement of the numbers will be an "equivalent nine's complement." This is formed by complementing the numbers to one less than the maximum, i.e., two. The complement of the numbers in the highest order are shown in Table 2.

TABLE 2

| Highest order digit | "Equivalent nine's complement" |
|---|---|
| 0 | 2 |
| 1 | 1 |
| 2 | 0 |

Now assume that the desired count is 3.6 Mhz. The dial preset is determined by the following relationship:

$$\text{Dial Preset} + \text{Offset} = \text{Desired Count} \quad (1)$$

Using the values of this example, the offset is 1.6 Mhz, the desired count is 3.6 Mhz and the dial preset is determined from relationship (1) as 2.0 Mhz.

The value at which the counters must be preset is determined by the following relationship:

$$\text{Counter maximum} - \text{desired count} = \text{required preset} \quad (2)$$

Using the values of this example, the counter maximum is 31.59, the desired count is 3.6 and the required preset is determined from relationship (2) as 27.99.

As can be seen, by using the equivalent nine's complement system and the offset, the dial setting provides the required preset for the counter. Using the values of this example:

| | |
|---|---|
| Dial setting is | 02.00 |
| Equivalent nine's complement | 27.99 |

This latter number is the required counter preset as calculated using relationship (2). Therefore, by setting the dial counter at the value as determined by relationship (2) and using the encoder of this invention which provides the binary coded decimal equivalent nine's complement, the counter will be automatically preset with the desired number to produce the desired output frequency.

The numbers used in this example are in no way unique, and any values can be used in the relationships given in (1) and (2) whereby the equivalent nine's complement of the dial setting will be the count required for the counter, including the offset.

Figure 2:
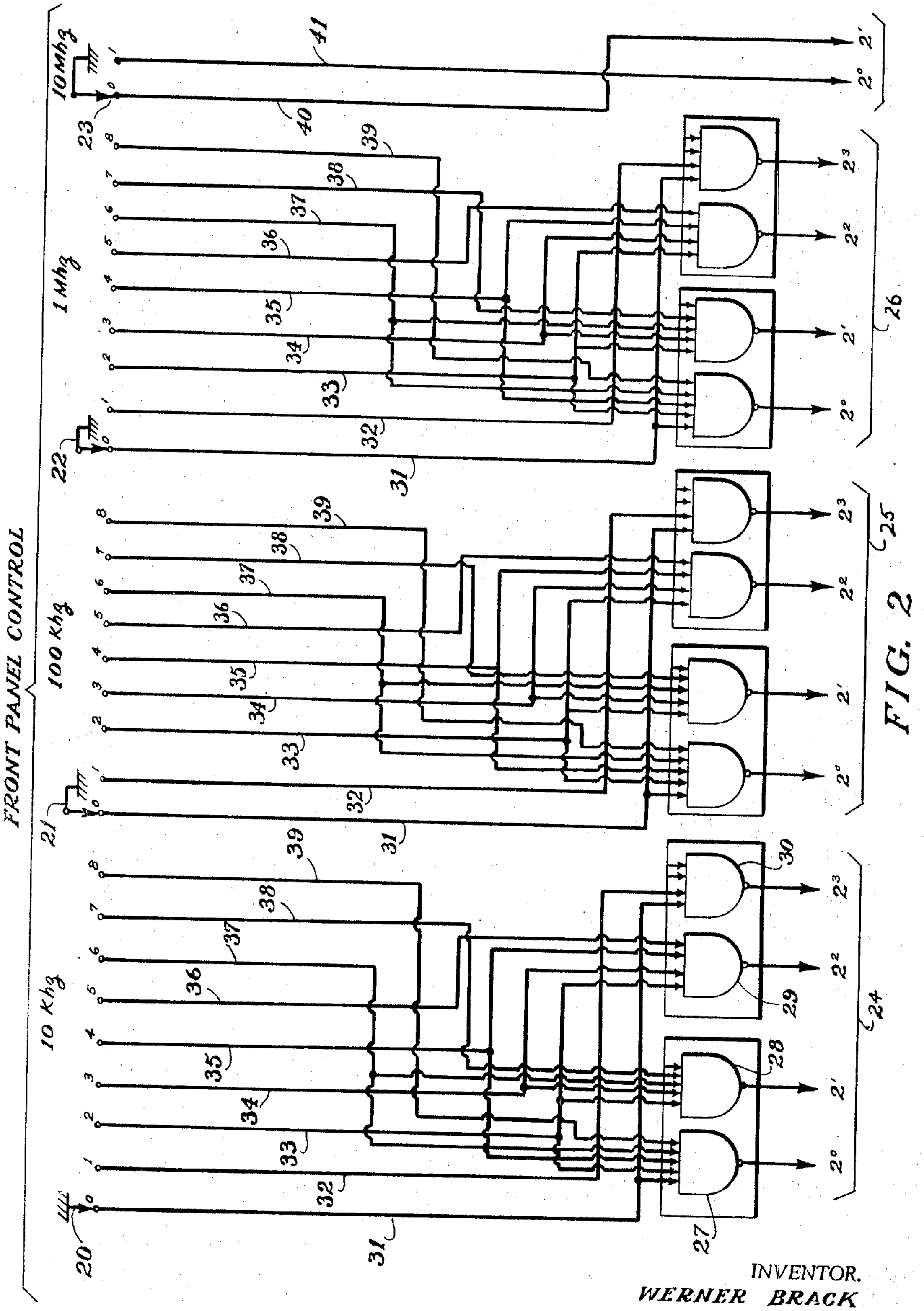
FIG. 2 is a circuit diagram of the encoder component of FIG. 1.

Referring to FIG. 2, the decade switches 10, and the encoder 11 is shown in detail. Four decade switches are shown, 20, 21, 22, and 23, however, the total number can vary with the requirements. Though decade switches 20, 21, 22 are identical and have 10 positions each; The fourth decade switch 23, has only three positions. Each of the identical decade switches has an identical encoder 24, 25, 26 associated therewith. One set of switch and encoder 20 and 24 will hereinafter be described, it being understood that the other identical sets will operate similarly.

The decade switch 20 comprises a rotatable switch, one end of which is grounded, and 10 control positions, labeled 0 through 9. The encoder 24 is shown comprised of four logical NAND-gates 27, 28, 29, 30. These NAND gates operate such that their output will be a logic "1" if any of its inputs are logic "0." Each of the NAND gates represents a power of two, such that the output of NAND-gate 27 indicates $2^0$ or 1; the output of NAND-gate 28 indicates $2^1$ or 2; the output of NAND-gate 29 indicates $2^2$ or 4 and the output of NAND-gate 30 indicates $2^3$ or 8. Wires are connected between the contact positions of the decade switch 20 and the encoder 24 in a manner that the output from the encoder 24 will represent the binary coded decimal equivalent nine's complement as shown in Table 1.

Wire 31, from the 0 position of the decade switch, provides an input to NAND-gates 27 and 30. The outputs from these gates indicates a value of 1 and 8, or 9. As seen from Table 1, this is the binary coded decimal nine's complement of 0. Wire 32 from position 1 of the decade switch provides an input to NAND-gate 30 which indicates a value of 8. Similarly, from position 2, wire 33 provides inputs to NAND-gates 27, 28, 29 indicating a value of 1+2+4 or 7. Wire 34 from position 3 inputs to NAND-gates 28 and 29 for an output of 2+4, or 6. Wire 35 from position 4 inputs to gates 27 and 29 for an output of 1+4, or 5. Wire 36 from position 5 inputs gate 29 for an output of 4. Wire 37 from position 6 inputs gates 27 and 28 for an output of 1+ 2, or 3. Wire 38 from position 7 results in an output of 2 through NAND-gate 29, and Wire 39 from position 8 results in an output of 1 through NAND-gate 27. Position 9 has no wire connected to it and results in a zero output which is in accordance with Table 1.

Decade switches 21 and 22 together with their encoders 25 and 26 operate in exactly the same manner. Each of the decade positions cover a preset incremental step. In our embodiment, decade switch 20 has 10 Khz positions; switch 21 has 100 Khz. positions and switch 22 has 1 Mhz positions.

In the embodiment of the invention shown in FIG. 2, the maximum frequency setting desired is 29.99 Mhz. As a result, the highest order digit reaches a maximum of 2, and it is not necessary to use a complete decade switch for the highest order, nor any encoder logic. Alternatively, a decade switch could be included and only three positions used. Also, in order to provide uniformity and flexibility, logic could be included and so wired as to provide the proper outputs. As shown in FIG. 2, the output from the zero position of switch 23 indicates 2 along line 40, and the output from the 1 position, along line 41 indicates a 1. The output from the 2 position is zero since there is no output line. These outputs agree with the equivalent nine's complement as shown in Table 2.

Figure 3:
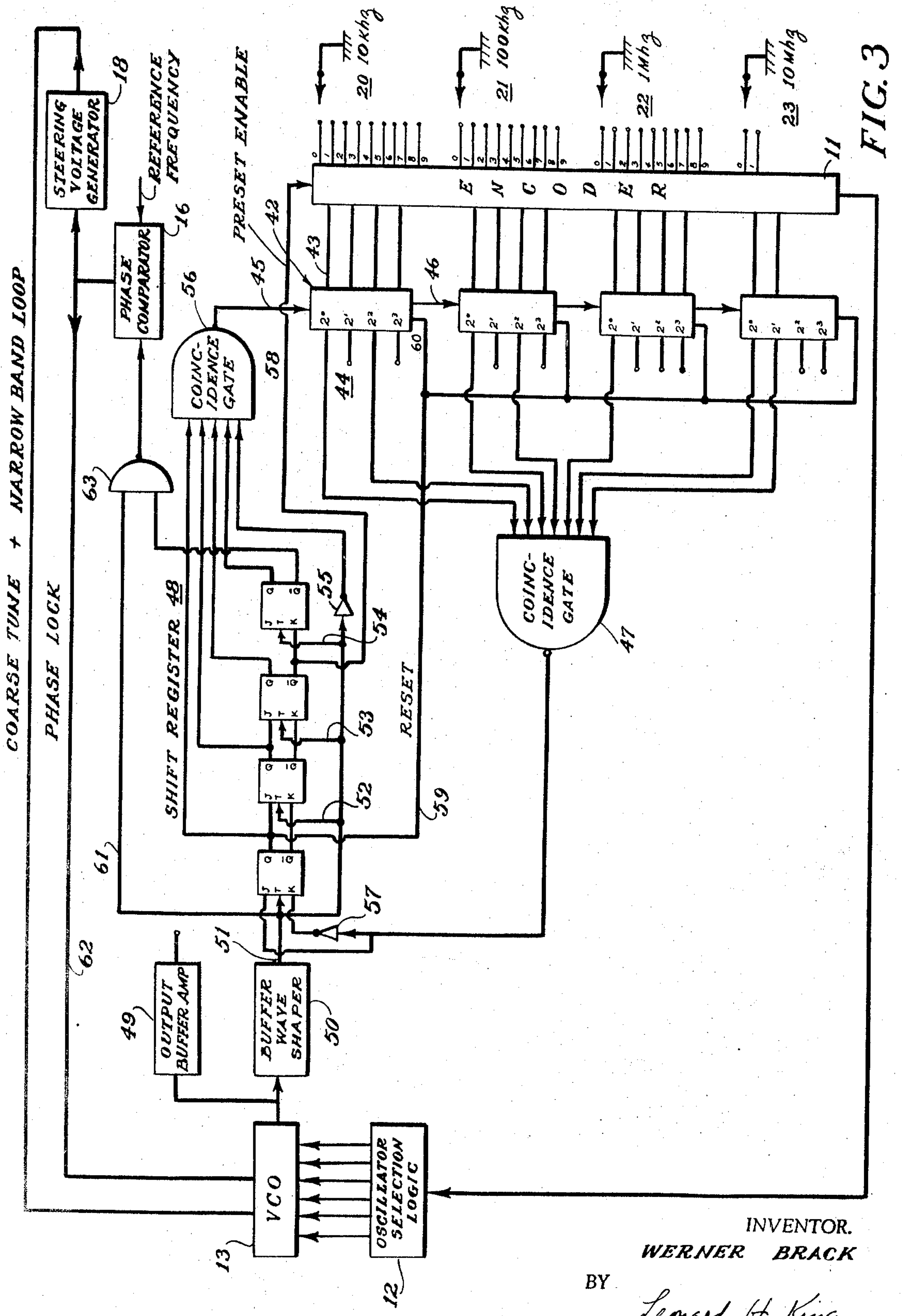
FIG. 3 is a circuit diagram of part of the system shown in FIG. 1.

FIG. 3 shows in detail, that portion of FIG. 1 which is enclosed within the dotted line. Switches 20–23 are set with the frequency desired, and the value is encoded by the encoder 11, as hereinbefore described. The outputs from the encoder feed a presettable decade counter 42. The counter comprises a plurality of stages equal in number to the number of switches. Each counter has a number of inputs 43 and outputs 44 for a power of two and each able to be preset. The output side 44 is preset by attaching wires to those terminals which constitute the number to which the counter will count. The input side 43 is preset by a pulse appearing on the line. The input side presets the number from which the counter begins to count. Clock pulses enter into the counter stages through 45 and a pulse to the next stage leaves on line 46.

Counters and encoders of the type described can be comprised of standard components as are well known in the art. For example, the encoder can be comprised of commercially available integrated circuits, such as type MC–1800, while the counter can be comprised of integrated circuit components, type MC–838, and have an input circuit comprised of integrated circuit components, such as type MC–849, for presetting the counters. Diodes can be placed between stages of the counter as is well known.

In the embodiment shown in FIG. 3, the output wires attached to the lowest stage of the counter 42 are at terminals $2^0$ and $2^2$ indicating a maximum count of 5. On the next stage, similarly, the output wires indicate a maximum count of 5. The next stage has a wire connected only to the $2^0$ terminal, indicating a maximum count of $2^0$ or 1. The highest order stage is set to indicate a count of $2^0+2^1$, or 3. Thus, the maximum value to which the counter is set to count is 3155.

When the counter reaches the maximum count of 3155, as is preset in the embodiment shown, an output appears on each of the lines feeding the coincidence gate 47. Coincidence gate 37 is a NAND gate and operates such that its output will be a logic "0" whenever all of its inputs are logic "1." Under all other conditions, the output of this gate will be a logic "1." A coincidence gate which can typically be used is the integrated circuit component MC–3015.

The output pulse from coincidence gate 47 is applied to the first stage of shift register 48. The shift register is composed of stages of J–K flip-flops. These are bi-stable devices having three input terminals, J, K, and T. The J input terminal is the set input terminal; the K terminal is the reset terminal; and the T input terminal is the trigger terminal. Operation, briefly, is as follows:

The presence of a logic "1" at the J terminal followed by a trigger pulse on the trigger terminal sets the flip-flop. Conversely, the presence of a logic "1" on the reset terminal K followed by a trigger at the trigger terminal T results in resetting the flip-flop.

To indicate its present state, a J–K flip-flop has two output terminals labeled Q and $\bar{Q}$. When, in its normal or set state, the Q has a "1" output and the $\bar{Q}$ has a "0" output. When the flip-flop assumes the reset state, the logic signals present at the two output terminals are reversed so that the logic "1" is present at the $\bar{Q}$ output terminal and the logic "0" is at the Q terminal.

The trigger pulse for the shift register comes from the Voltage Controlled Oscillator 13. As shown in FIG. 3 (and FIG. 1), the dial setting from the switches 10, goes to the oscillator selection logic 12. This logic selects the proper oscillator to use. The output from the VCO 13 is fed through an output buffer and amplifier state 49 and then taken as the output of the entire system. The VCO output is also fed to a buffer and wave shaper 50 which provides a square wave output signal in response to an input sine wave signal from the oscillator. This square wave signal is used as the clock pulse for both the shift register and the counter.

The wave shaper output triggers the first stage of the shift register on line 51, the second stage from line 52, the third stage from line 53, and the last stage from line 54. The pulse also passes through inverter 55 and onto coincidence gate 56. The inverter 55 can be of the type MC–3005 and coincidence gate 56 is a NAND gate which has a logic "1" output as long as any of the inputs are logic "0" but has a "0" output when all of the inputs are a logic "1."

The output from the coincidence gate 47 is fed to the J input of the first stage of the shift register 48, and also through inverter 57 to the K input of that stage. Inverter 57 is similar to inverter 55.

The operation of the shift register will now be explained. Decade counter 42 counts each pulse which it receives and continues until it reaches the preset value of 3155. Until it reaches that value, not all of its output lines are energized and coincidence gate 47 will produce a logic "1" for each count. The "1" pulse will feed the J input directly and simultaneously be inverted to a logic "0" and applied to the K input. When the clock pulse appears on line 51, it will trigger the flip-flop to set it. However, since this flip-flop is already in the set state, no change in its output will occur.

Similarly, the remaining stages are in the set state having an output of logic "1" on the Q output and a logic "0" on the $\bar{Q}$ output. With each output feeding the next stage, at the occurrence of a trigger pulse, each flip-flop will remain in the set state and no change will occur.

Coincidence gate 56 has as its input, the Q outputs of all of the stages of the shift register as well as the output from the inverter 55. Coincidence gate 56 will have a logic "0" output as long as all of the inputs are logic "1." With all of the flip-flops in a set state, the Q outputs will be a logic "1" and the output from inverter 55 will change between "0" and "1" according to the clock pulse. The gate 56 will therefore normally send a pulse to the decade counter at each clock pulse occurrence, to advance the count of the counter by one.

When the counter reaches the preset count of 3155, all of the input lines to the coincidence gate 47 will be energized and gate 47 will have a logic "0" output. The "0" will go to the J input of the first stage of the shift register and simultaneously be inverted to apply a logic "1" to the K input. When the next clock pulse is applied to the trigger input of the first stage, the flip-flop will change into the reset condition. The Q output will now be a logic "0" and the $\bar{Q}$ output a logic "1." These outputs serve as the inputs to the J–K terminals respectively, of the second stage of the shift register. At the next clock pulse, the second stage will be put in a reset stage. Simultaneously, the first stage will be returned to its set stage.

Similarly at the third clock pulse, the third stage will be reset and following the fourth pulse the last stage will be reset and the first three stages returned to the set condition.

During normal operation, all the Q outputs are "1" and coincidence gate 56 produces output clock pulses as the pulse from inverter 55 varies from "1" to "0." However, as the shift register stages are reset, the Q output becomes "0" and the coincidence gate 56 will continue to have a constant "1" output without any variations. The counter will, therefore, not receive any pulses during operation of the shift register.

At the Q output of the first stage, line 59 provides a reset pulse for the decade counter to clear it. The reset pulse is applied to each stage of the counter as shown at 60 for the first stage.

At the $\overline{Q}$ output of the third stage, line 58 provides an enable condition for the encoder 11. This presets the counter to any preset number desired for operation of the system.

Figure 5:
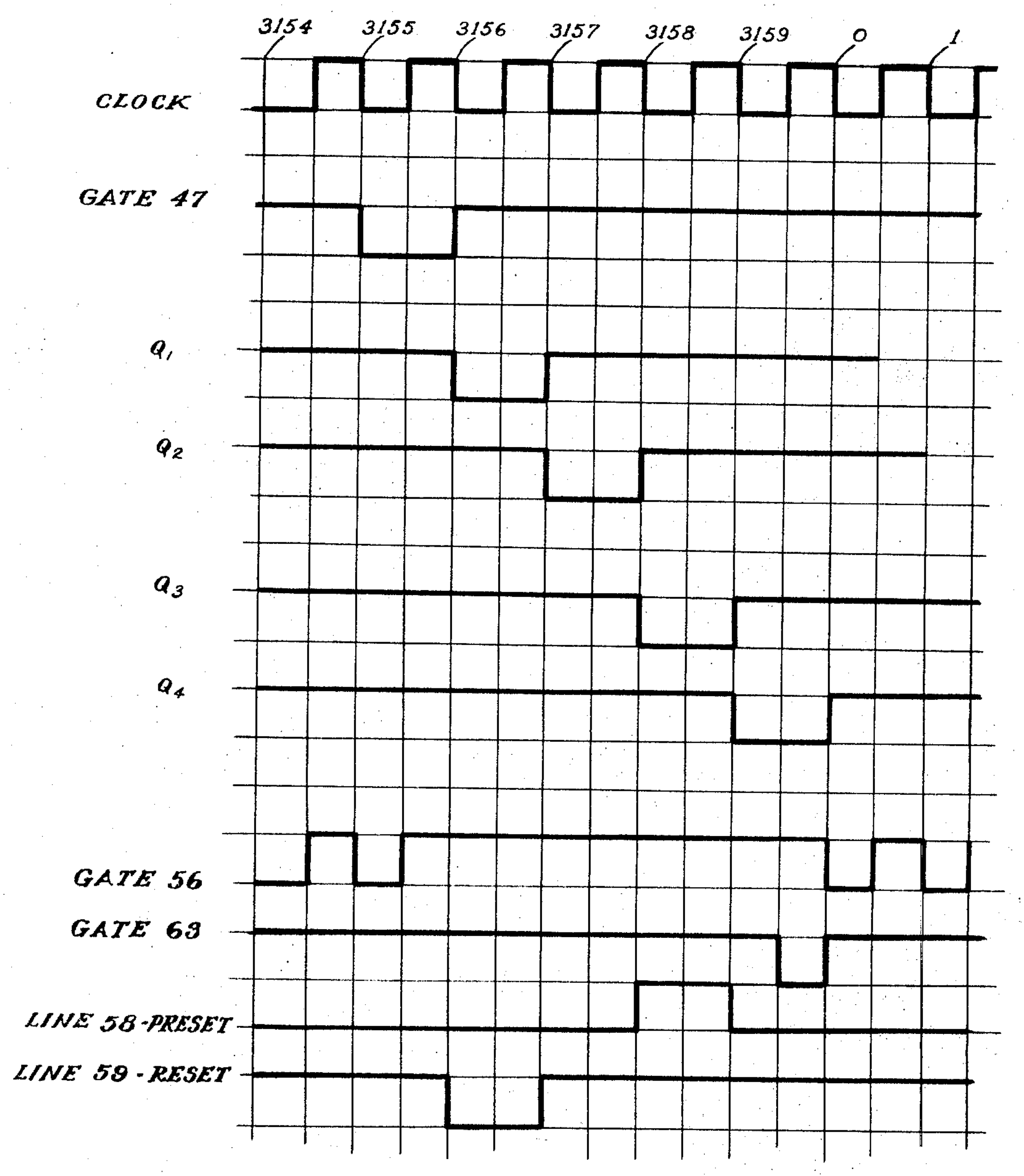
FIG. 5 shows waveforms useful in the explanation of FIG. 2.

Referring to FIG. 5, the clock pulses from the buffer wave shaper 50 are shown on the first line. Until the 3155 pulse, the output from coincidence gate 47 is a logic "1" and the shift register remains set with the Q output at a logic "1" and the $\overline{Q}$ output at a logic "0." The clock pulses are inverted and sent to coincidence gate 56 which passes clock pulses to the counter. At the occurrence of clock pulse 3155, coincidence gate 47 produces a "0" output. This enables the first stage of the shift register such that when the next clock pulse arrives, 3156, the first stage is triggered into a reset position with the $Q_1$ output being at a logic "0." The resetting of the first stage enables the second stage so that at pulse 3157 the second stage is triggered into a reset position and $Q_2$ is at a logic "0." The preceding first stage is again put into a set position with the $Q_1$ output returning to a logic "1." This continues until all the stages of the shift register have been reset and subsequently set.

As long as a stage of the shift register is in a reset position, and a Q output is a "0," coincidence gate 56 will remain in a "1" state and no pulsating output will appear. The reset for the counters, line 59, is taken from Q, and is the same output as $Q_1$. The preset for the encoders, line 58, is taken from $\overline{Q}_3$ and is the inverse of the $Q_3$ output.

The operation of the system is as follows: The counter continues to count from the preset input until the maximum count. In the example as previously given, the counter would be preset to the number 2799 and would count until the number 3155 is reached. At that time the coincidence gate is triggered and the next count resets the first stage of the shift register. This automatically stops the counter by means of the gate 56 and simultaneously resets the counter through line 59.

At the occurrence of the next pulse, 3157, the second stage of the shift register is reset and no further changes occur. At the 3158 pulse, the third stage is reset and the enable line is energized to preset the counter and encoder to their initial conditions. At the 3159 pulse, the last stage of the shift register is reset and the output from this stage is sent to the phase comparator as will be described. The entire system is now ready to start the count again, and with the next pulse, the counter begins counting.

Although the embodiment shown in FIG. 3 employs specific logic blocks, it is understood that these are not unique, and choosing a logic "1" or logic "0" as a signal for setting a condition is merely a matter of design choice. These signals as well as logic blocks could be modified as is known in the art, OR blocks could easily be substituted for the NAND blocks and all the signals would be inverted.

By providing a shift register in conjunction with the counter, the counter and encoder can settle down, reset and be preset to its initial condition without requiring any delay between counting cycles. No time is lost in resetting and no error is introduced by any delays. The resetting takes place during the actual last few counts and the counter is ready for the next cycle immediately upon completing the first cycle.

In order to provide the accuracy and stability required for a frequency synthesizer, the output from the VCO is compared with a stable reference frequency. As shown in FIG. 3, the clock pulses from the VCO 13 through the wave shaper 50 are taken on line 61 to a NAND-gate 63. The other input to gate 63 is taken from the $\overline{Q}$ output of the last stage of the shift register. This output is normally a logic "0" when the flip-flop is in a set condition. When the counter has reached its maximum and the shift register is reset, the $\overline{Q}$ output changes to a logic "1." The output of gate 63 is a logic "0" so long as its inputs are both logic "1." When one of the inputs becomes a "0," the output is a logic "1." Thus, when the last stage of the shift register is reset, the gate 63 will emit a pulse. The phase of the pulse will be identical to the phase of the clock pulse from line 61 which comes from the VCO.

Although the input to gate 63 is shown from the $\overline{Q}$ output of the last stage, it could come from any other stage, and could likewise come from the Q output by modifying the logic. The pulse which goes to the phase comparator comes directly from the voltage controlled oscillator through the buffer wave shaper. As a result, a direct comparison of the VCO and the reference frequency can be made eliminating noise and phase jitter which is generally found in the prior art.

The output from the gate 63 is one input to the phase comparator 16. The other input is from a reference frequency, usually a stable crystal oscillator. When the two signals are synchronized, there is only a normal DC error signal proportional to the phase difference between the two signals which results from the phase comparator. When the VCO is not in synchronism with the reference frequency, an AC signal results in the form of beat notes. The error signal is fed back to the VCO along line 62 in a conventional manner, thereby providing a phase lock up between the two frequencies. The phase lock loop formed by line 62 is a wide band low gain loop system wherein the pull in range is almost the same as the lock in range.

In addition to the phase lock loop, the error signal which comes from the phase comparator 16 is also used as an input to a steering voltage generator 18. The output from the steering voltage generator 18 is a voltage level which is also fed to the VCO 13. This voltage provides a coarse tuning signal for the VCO's. When the phase detector indicates a loss of synchronism, the steering voltage generator produces a sweep voltage which quickly brings the frequency of the VCO into close proximity to the reference frequency. The phase lock loop can then lock up the two frequencies very quickly. The coarse tuning signal forms a second loop. This is a narrow band high gain loop having a much larger lock-in range than pull-in range. This permits the signal to drift quite far without losing the lock completely.

Figure 4:
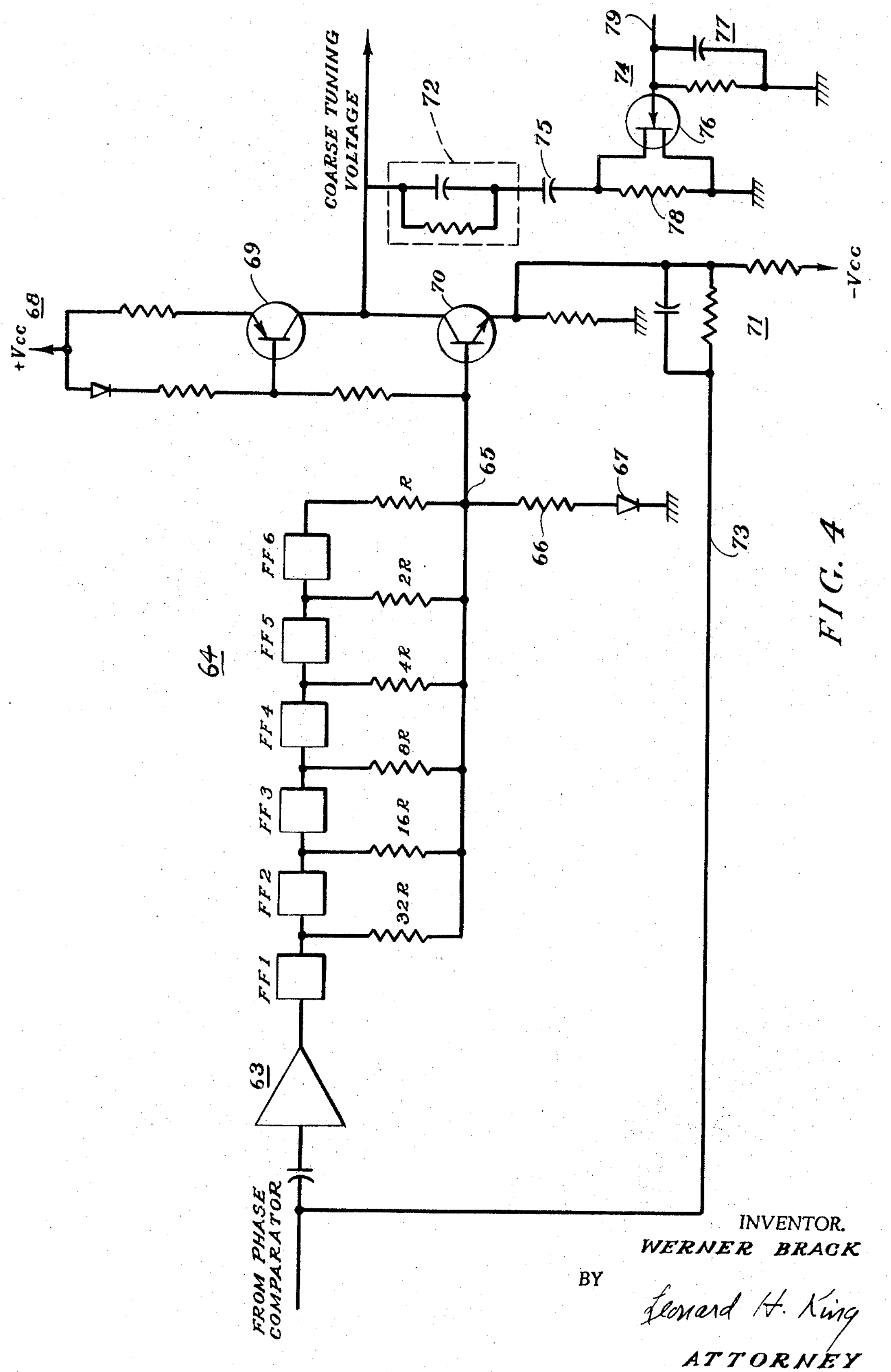
FIG. 4 is a detail circuit diagram of the steering voltage generator component of FIG. 1.

Referring now to FIG. 4, a detailed embodiment of the steering voltage generator is shown. The error signal from the phase comparator passes through an amplifier and wave shaper 63 and then on to a staircase generator 64. The staircase generator comprises a number of flip-flops, FF1–FF6. Each flip-flop is connected to trigger the next stage. Connected to the output of each stage is a weighted resistor. The resistances are arranged with binary weights such that the output resistor of flip-flop 6 has a value R, the output resistor of flip-flop 5 has a value 2R, down until flip-flop 1 whose output resistor has a value of 32R. The ends of all the output resistors connect to a common summing point 65. The staircase generator as arranged, provides an increased stepwise voltage as the flip-flops are set from flip-flop 1 to flip-flop 6.

Resistor 66 and diode 67 are connected between summing terminal 65 and ground to provide better temperature tracking in the circuit. Summing amplifier comprises a PNP-transistor 69 and an NPN-transistor 70. These transistors are connected with proper resistances and diodes to supply voltage −Vcc and +Vcc as shown.

Connected to the summing amplifier is the output of the staircase generator 64 as well as direct connection 73 from the phase comparator via lead compensating network 71. The output of the summing amplifier is connected to lag network 72. These networks are respectively series and parallel RC network as are known in the art and are required to provide loop stability and reduce noise in the system.

An electronic switch 74 is coupled to the lag compensation network 72. The electronic switch 74 is shown having an N-channel field effect transistor with an RC circuit coupled to its gate, and a resistor 78 between the source and drain.

The operation of FIG. 4 will now be described. If the reference voltage and the VCO voltage are out of lock, an AC signal will appear from the phase comparator into the steering voltage generator. The AC signal will be the frequency difference between the two signals. Assuming the reference signal to be 5 Khz and the counter output is 4 Khz, a 1 Khz signal will appear at the input of the staircase generator. This signal is converted to a DC pulse and amplified such that at the output of 63 there will appear a 1 Khz square wave pulse. These pulses actuate the first stage of the flip-flops which cause a small voltage to appear at the summing junction 65 from resistor 32R. As the flip-flops continue to be activated in sequence, a greater voltage appears at the summing junction. This voltage is amplified by the DC amplifier 68 and serves as the coarse tuning voltage for the VCO.

Should the signal from the VCO be greater than the reference signal, then all the flip-flops are turned on and then at the occurrence of the next pulse they recycle from the bottom end and combine in stepwise fashion to produce a sweep output voltage. In each case, the number of flip-flops which are triggered is dependent upon the error signal from the phase comparator.

As a voltage appears at the summing junction it is fed back to the VCO to bring the VCO frequency closer to the reference frequency. As the counter output frequency and the reference frequency approach each other, the pulse rate at which the staircase generator is driven becomes slower and slower until the frequencies are close enough for the phase lock circuit to achieve lock. At this point no further pulses are produced and the output of the staircase generator is a DC voltage. As a result, the circuit is a self-adaptive system in that the frequencies approach each other gradually. The system slows down accordingly making it easier for the loop to acquire lock.

The lead-lag compensation circuits are included in the steering voltage generator to provide stability in the loop and reduce noise. However, these loop filters introduce a large time constant which would normally delay the speed of the tuning operation. The electronic switch is therefore added to increase the speed of the system during a tuning operation. The AC output from the phase comparator, which indicates a loss of lock-up, is fed into the electronic switch at 79. This signal is rectified, amplified, and filtered and is applied to turn off the FET 76. When the FET is off the resistance is equal to several hundred megohms, effectively producing an open circuit. Therefore, the loop filter 72 is connected to ground through resistor 78, thereby preventing all the high frequencies from being shunted to ground through capacitor 75. This increases the bandwidth of the loop thereby increasing the speed in which lock up can be achieved. When the system is in lock, FET 76 is on, the resistance through it is very low, in the range of 100 to 200 ohms. As a result, resistance 78 is effectively shorted, capacitor 75 is grounded, and all the high frequencies in the loop are shunted to ground, making the coarse loop a very narrow bandwidth loop. By using an electronic switch, as soon as lock-up is lost, the filter is disconnected without any delay, thereby permitting immediate retuning.

The bandwidth and gains of the two loops are arranged in such a manner that the system has a large amount of hysteresis, i.e., the system has a much larger lock range than pull-in range. During the tuning operation, lock will not be achieved until the steering voltage has tuned the VCO very close to the reference frequency. Once lock is achieved, however, any drift occurring due to temperature and other effects can easily be corrected by the high gain narrow bandwidth loop without loss of lock. This is of great importance since retuning of the VCO by the steering voltage generator would result in momentary loss of communications.

While a particular embodiment of the invention has been shown as described, it is evident that modifications may be made. The following claims are intended to cover such modification as fall within the scope of the invention.

What I claim as new and desire to secure by Letters Patent is:

1. A frequency synthesizer including:

a. signal producing means for generating a reference signal having a precise predetermined frequency;

b. a voltage controlled oscillator tunable in discrete frequency steps over a predetermined frequency range and producing an output signal;

c. means for tuning said oscillator to a predetermined output frequency value;

d. encoding means for converting said frequency value into its equivalent nine's complement and formating said last number into binary coded decimal form;

e. a shift register having a plurality of stages, f. a presettable counter, having a maximum count equal to the upper frequency limit of said synthesizer less the number of stages in the shift register, said binary coded decimal equivalent nine's complement number being applied to said counter to fix the beginning counting number, and said counter counting said output pulses from said voltage controlled oscillator;

g. coincidence means for providing a signal at the occurrence of the maximum count in said counters, said signal activating said shift registers to shift at the occurrence of each subsequent output pulse from said voltage controlled oscillator until all said stages have shifted;

h. gate means for producing a feedback signal when all said stages have shifted;

i. resetting means for presetting said presettable counter to its initial conditions during the operation of said shift register;

j. a phase detector coupled to said signal producing means and said gate means, said phase detector responding to said reference signal and to said feedback signal for producing an error signal related to the difference between said reference signal and said feedback signal; and k. network means for applying said error signal to said voltage controlled oscillator to adjust the frequency of said oscillator to eliminate said phase displacement.

2. The frequency synthesizer as in claim 1 wherein the input to said gate means is directly from said voltage controlled oscillator such that when all stages of said shift register have shifted, said gate means are enabled to permit said output pulses to pass as the feedback signal.

3. The frequency synthesizer as in claim 2 wherein said output pulses from said voltage controlled oscillator are AC signals and further including wave shaping means interposed between said voltage controlled oscillator and said counter, shift register and gate means.

4. The frequency synthesizer as in claim 1 further including voltage generating means, the input to which is said error signal, and producing a voltage level proportionate to said error signal, said voltage level being applied to said voltage controlled oscillator as a coarse tuning voltage.

5. The frequency synthesizer of claim 4, wherein said voltage generating means includes a staircase voltage generator, producing a sweep voltage, a summing amplifier for combining all said stepwise voltage levels, a lead compensation network, a lag compensation network, and an electronic switch responsive to an out-of-lock condition and being automatically disconnected during the tuning of said voltage controlled oscillator.

6. The frequency synthesizer of claim 1, wherein said voltage controlled oscillator comprises a plurality of oscillators each tunable over a narrow band of said frequency range and further including selection means responsive to said decade switches for selecting the appropriate one of said plurality of oscillators.

7. The frequency synthesizer of claim 1, wherein the maximum count includes the value of an offset frequency, and the number set on said decade switches is the desired frequency less said offset frequency.

8. A frequency synthesizer as in claim 1, wherein said network means includes a first feedback loop having a wide bandwidth and low gain for coarse tuning, and a second feedback loop having a narrow bandwidth and high gain for fine tuning.

9. A frequency synthesizer as in claim 8, wherein said second feedback loop includes electronic switching means capable of controlling the time constant of said second feedback loop and responsive to an out-of-lock condition.

10. A frequency synthesizer as in claim 9, wherein said electronic switch comprises a field effect transistor which disconnects a large time constant circuit at the occurrence of an out-of-lock condition, and reinserts said large time constant circuit during lock up conditions.

11. The frequency synthesizer of claim 1 wherein said means for tuning said oscillator to a predetermined output frequency value comprise decade switches.

* * * * *